United States Patent [19]

Wei

[11] Patent Number: 4,644,353

[45] Date of Patent: Feb. 17, 1987

[54] PROGRAMMABLE INTERFACE

[75] Inventor: James Y. Wei, Santa Clara, Calif.

[73] Assignee: Intersil, Inc., Cupertino, Calif.

[21] Appl. No.: 745,580

[22] Filed: Jun. 17, 1985

[51] Int. Cl.$^4$ ............................................. H04Q 1/00
[52] U.S. Cl. ........................... 340/825.83; 340/825.86; 340/825.87
[58] Field of Search ...................... 340/825.79, 825.83, 340/825.86, 825.89, 825.87, 825.88, 825.22; 179/18 GF, 18 H, 175.23; 307/465, 475, 468; 365/103, 231, 242

[56] References Cited

U.S. PATENT DOCUMENTS

| | | | |
|---|---|---|---|
| 3,852,723 | 12/1974 | Wu | 340/825.83 |
| 3,872,439 | 3/1975 | Salam | 340/825.79 |
| 4,009,468 | 2/1977 | Calcagno et al. | 340/825.79 |
| 4,024,352 | 5/1977 | Mukaemachi et al. | 340/825.89 |
| 4,289,982 | 9/1981 | Smith | 307/468 X |
| 4,490,812 | 12/1984 | Guterman | 307/465 X |
| 4,551,814 | 11/1985 | Moore et al. | 307/465 X |

OTHER PUBLICATIONS

Horrell, J. L. "A Programmable Switching System in an Asynchronous Digital Node", National Telemetering Conference, Washington, D.C., Apr. 1971, pp. 283-288.

Kovacs, E. "Multiple Matrix Switch: A High Performance Universal Switching System", International Automatic Testing Conference, San Diego, CA, USA, Nov. 1978, pp. 112-118.

Primary Examiner—Ulysses Weldon
Attorney, Agent, or Firm—Stanley C. Corwin; Mark Mollon

[57] ABSTRACT

A programmable interface to selectively couple the terminals of an electronic system to desired circuit locations within the system. By applying programming signals to the input terminals of the interface in a prescribed sequence, the interface is programmed so that subsequently applied control signals will be coupled to the desired circuit locations. The function served by each terminal thus depends on the programming sequence. Reprogramming can change the function of each of the terminals by coupling them to different circuit locations.

11 Claims, 7 Drawing Figures ced to any other system input unless a complete reprogramming is undertaken. Therefore, unless a programming initiation signal occurs, once programming is done, even 10 volt pulses to the interface inputs will not affect the programming. The programming initiation signal in the presently preferred embodiment of the invention involves raising the system power voltage from 5 to 10 volts for a short period of time.

PROGRAMMABLE INTERFACE

BACKGROUND OF THE INVENTION

1. Field of the Invention

This invention relates to means for coupling an electronic system to a source of control signals.

2. Prior Art

The present invention is concerned with coupling control signals to the appropriate point in an electronic system. The need for a system such as is disclosed herein can arise, for example, in the manufacture of LSI semiconductor chips. Manufacturers often make the same basic product for two or more customers, but because of customer interface requirements must make two or more products which differ only in the pin number assignments for the various control signals. A certain customer may, for example, request that a "read" signal be applied to pin 2 and a "write" signal to pin 5 whereas a second customer who wishes to purchase the identical product wishes "read" to be applied to pin 7 and "write" to pin 2.

According to prior art technology, in order to satisfy the two customers, the manufacturer would be obliged to make two different products differing only in the pin assignments.

Prior to the present invention there has been no means available to make internal control signal connections in an electronic system after manufacture is complete.

SUMMARY OF THE INVENTION

The programmable interface of the present invention allows an electronic system to be manufactured and tested prior to making a decision as to an allocation of which input terminals are to be used for the various control signals. The interface can be initially programmed to allocate the required control signals to predetermined input terminals for the purpose of testing, and later the interface can be reprogrammed, changing the terminal allocations to suit a particular application.

The invented interface includes a gated crossbar switch type of arrangement which provides multiple possible paths for control signals applied to the input terminals. Each column of the crossbar is coupled to an interface input terminal, and each row of the crossbar is coupled to an interface output (i.e., the controlled system input). Those intersections which are possible signal paths are connected by a gate which is controlled by an EEROM (electrically erasable read-on memory). By setting the appropriate EEROMs, control signals applied to the interface input terminals will be gated to the desired system inputs (crossbar outputs).

Programming to set the EEROMs is accomplished by applying programming pulses to the interface input terminals in a predetermined sequence. No additional or special terminals are required to accomplish the programming function. This is possible because the programming pulses have a form which differs from any control signal which may be applied to the interface input during normal operation. Thus normal control signals will not affect the programming. For example, if the normal system operation involves 5 volt control signals, the programming pulses may have a 10 volt amplitude. Also, once a particular interface input terminal is programmed to be coupled to a system input, a lockout signal prevents that terminal from being coupled to any other system input unless a complete reprogramming is undertaken. Therefore, unless a programming initiation signal occurs, once programming is done, even 10 volt pulses to the interface inputs will not affect the programming. The programming initiation signal in the presently preferred embodiment of the invention involves raising the system power voltage from 5 to 10 volts for a short period of time.

DETAILED DESCRIPTION OF THE INVENTION

Figure 1:
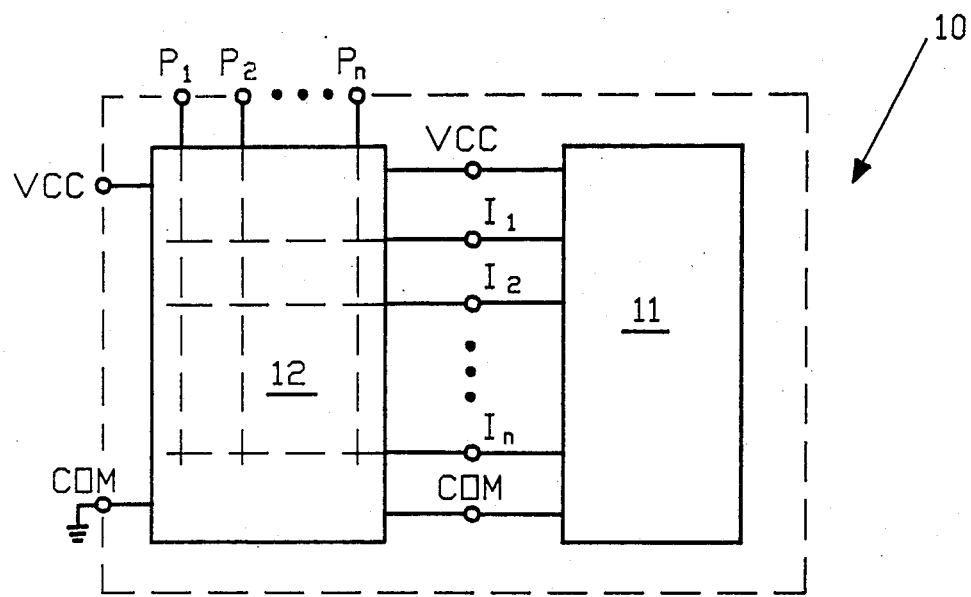
FIG. 1 is a block diagram showing how the present invention may be connected to an associated electronic system which is to be controlled.

FIG. 1 shows an electronic package 10 which is comprised of an electronic system 11 to which is coupled a programable interface 12 according to the present invention. Pins $P_1, P_2, \ldots P_n$ are used to carry control signals to the interface 12 which in turn directs them to the appropriate system inputs $I_1, I_2, \ldots I_n$ as desired, not necessarily in that order. For example, in a particular application, it may be desired that the control signal applied to pin $P_1$ be coupled to system input $I_{23}$, $P_2$ to $I_5$, etc. By properly programming interface 12, any signal applied to $P_1$ will be coupled to $I_{23}$, $P_2$ to $I_5$, etc. The programming can be done after manufacture and test has been completed. At a later time the interface can be reprogrammed to, for example, couple control signals from $P_1$ to $I_5$ or any other I input instead of $I_{23}$. Coupling of the pins $P_1, P_2 \ldots P_n$ to the desired I inputs is accomplished through a gated crossbar switch which is indicated in FIG. 1 by the dotted lines within interface 12. The dotted lines show the P busses as columns and the I busses as rows. Each intersection which represents a possible signal path for a particular application is coupled with a gate which is controlled by an EEROM as described below.

Figure 2:
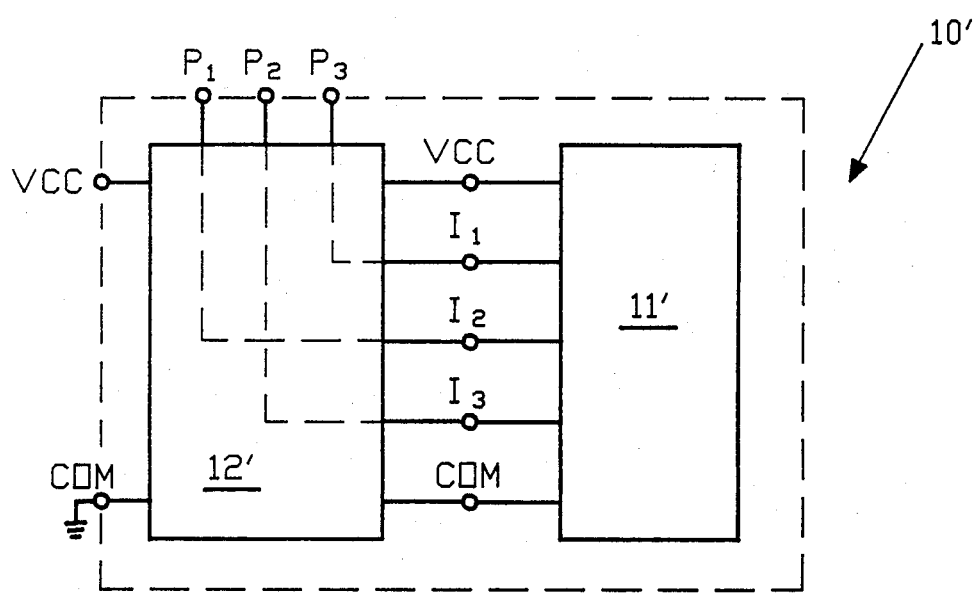
FIG. 2 is a block diagram of a particular example of an interface according to the present invention connected to an associated electronic system showing the control signal paths through the interface, as programmed according to the example described in the specification.
Figure 5:
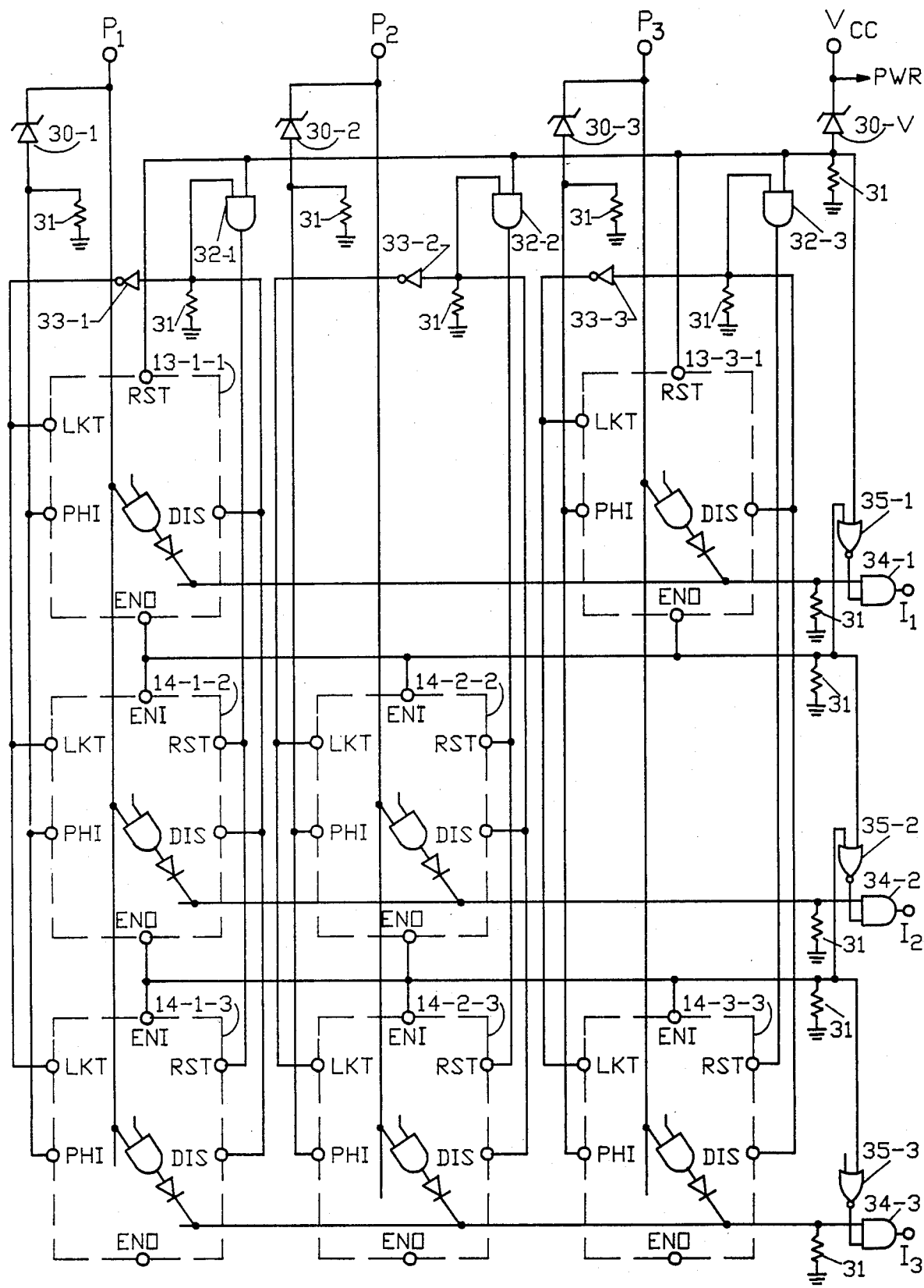
FIG. 5 is a schematic diagram of a specific example of a programmable interface according to the present invention.

For purposes of explanation, the schematic of a relatively simple programable interface is shown in FIG. 5. A block diagram of this simple example is shown in FIG. 2. The interface of FIG. 5 has three input pins $P_1$, $P_2$, and $P_3$ which are to be coupled to system inputs $I_1$, $I_2$, and $I_3$. In the interface example as shown in FIG. 5, $P_1$ can be coupled to $I_1$, $I_2$, or $I_3$; $P_2$ can be coupled to $I_2$, or $I_3$; and $P_3$ can be coupled to $I_1$ or $I_3$.

The interface 12', as noted above is arranged in the form of a crossbar switch with a series of input busses corresponding to the input terminals $P_1$, $P_2$, and $P_3$, and a series of output busses corresponding to the controlled electronic system inputs $I_1$, $I_2$, and $I_3$. A control signal coupler (designated as 13 or 14) is connected at each intersection of a P and I bus which corresponds to a possible coupling path. For purposes of explanation, numerical designations which refer to a component specifically associated with a particular input terminal P and system input I are coded with two dash numbers, the first being the terminal number and the second being the system input number. For example, the coupler associated with $P_2$ and $I_3$ is designated 14-2-3.

It will be noticed that no Control Signal Couplers appear at the $P_2/I_1$ or $P_3/I_2$ intersections. That is because for purposes of explanation an example was chosen which did not contemplate $P_2$ ever being coupled to $I_1$, or $P_3$ coupled to $I_2$ hence couplers at these intersections are not needed. It will also be noticed that the Control Signal Couplers (13) associated with the $I_1$ bus are not the same as the Control Signal Couplers (14) associated with the other I busses. The reason for this will become evident as the operation of the interface is explained.

The VCC terminal is used to supply power to both the interface 12' and the system 11', and is also used to feed a reset signal to the interface as a prelude to programming or reprogramming.

Figure 3:
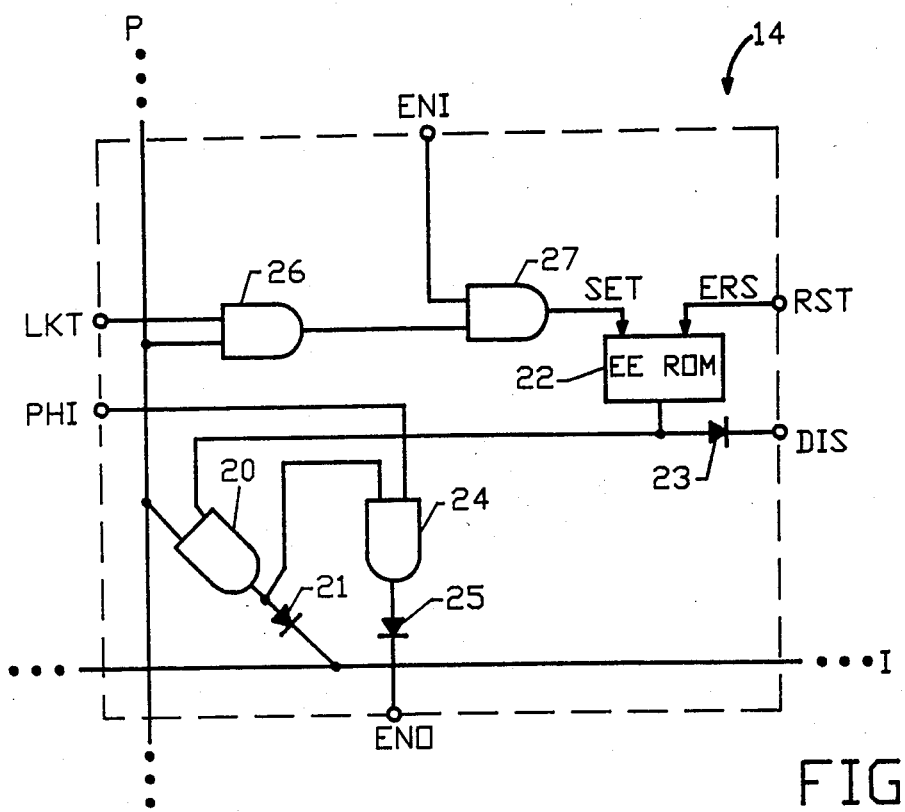
FIG. 3 is a schematic diagram of one type of Control Signal Coupler used in a presently preferred embodiment of the invention.

FIG. 3 is a circuit diagram of the Control Signal Coupler 14. Control signals are coupled through the coupler from the P bus to the I bus via AND gate 20 and diode 21. AND gate 20 allows a signal on the associated P bus to pass when the output of EEROM 22 is high.

EEROM 22 is a one bit electrically erasable programmable memory and is set or erased by signals applied to its SET or ERS inputs respectively. A set signal requires simultaneous signals on the P bus, the LKT (lockout) terminal, and the ENI (enable input) terminal. Erase requires only a signal on the RST (reset) terminal. The set function is accomplished through AND gates 26 and 27. When EEROM 22 is set (output high) it not only enables AND gate 20, but it provides a signal to the DIS (disable) bus through diode 23. Finally, when AND gate 20 is on and a signal appears on the PHI (P high) terminal, a signal is provided by AND gate 24 through diode 25 to the ENO (enable output) terminal.

Figure 4:
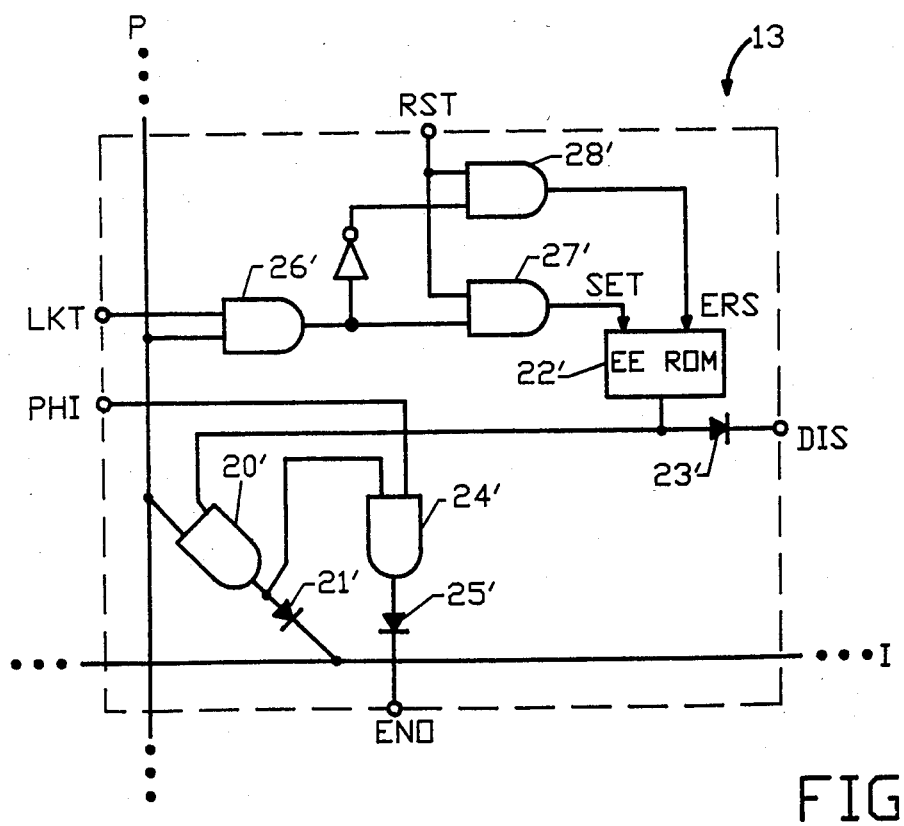
FIG. 4 is a schematic diagram of a second type of Control Signal Coupler used in a presently preferred embodiment of the invention.

Control Signal Couplers of the type shown in FIG. 3 are used at all of the active P bus/I bus intersections except those associated with the $I_1$ bus. The couplers associated with the $I_1$ bus (13) are of slightly different design and are shown in FIG. 4. Components of the Control Signal Couplers 13 which are the same as those of the Control Signal Couplers 14 are designated by the same numeral with an added prime to differentiate between the uses.

The difference between the couplers 14 and 13 resides in the erase function for the EEROM. In coupler 14 the EEROM is erased by a signal applied to the RST terminal without further condition. In coupler 13 the RST signal is applied to AND gate 28' which requires that AND gate 26' be off before it can generate the ERS signal to erase the EEROM.

Referring back to FIG. 5 it can be seen that each of the P terminals is coupled to the PHI terminals of its associated Control Signal Couplers through a zener diode (30-1, 30-2, and 30-3). The zener diodes 30 are each 5 volt zener diodes so that when any voltage up to 5 volts is applied to a P terminal the voltage at the associated PHI terminals will be zero. If 10 volts is applied to a P terminal, 5 volts will appear at the PHI terminals. Resistors 31 are provided between the zener diode cathodes and ground because the high impedances involved in the circuitry may prevent proper operation without a ground return. Similar resistors 31 are provided at other points in the circuit for the same reason.

The VCC terminal serves as the power input terminal for both the interface circuitry and for the controlled system 11'. In addition, a 5 volt zener diode 30-V couples a 5 volt signal to the interface circuitry when VCC is raised to 10 volts. When VCC is 5 volts (the normal operating voltage for the controlled system) the only function of VCC is to supply power to the circuitry of the system. As will be described below, a 10 volt pulse on VCC is the programming initiation pulse.

Figure 6:
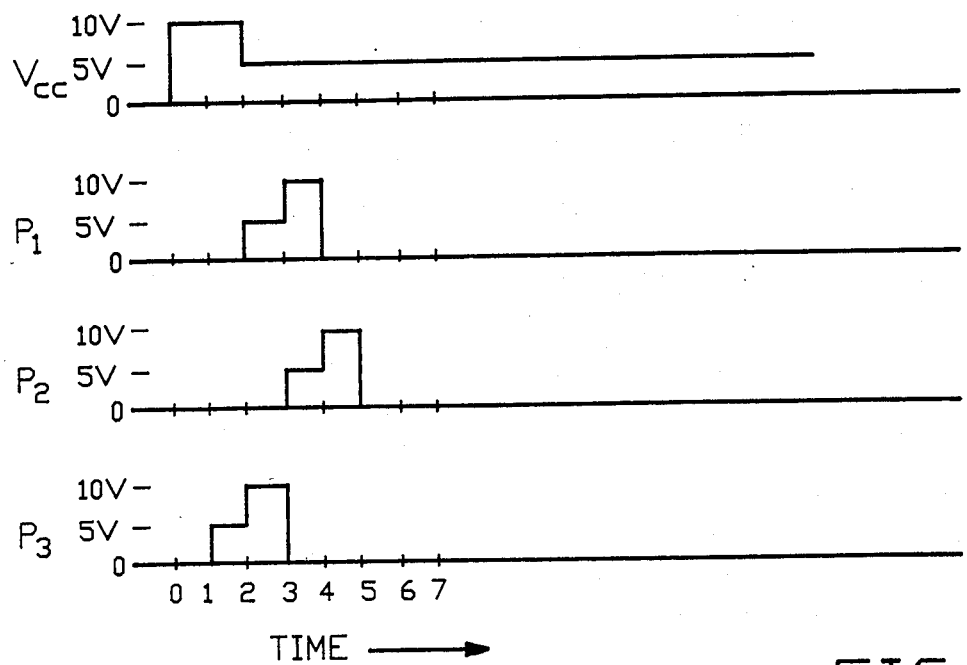
FIG. 6 is a timing diagram showing the sequence of programming pulses used to program the example described in the specification.

FIG. 6 is a timing diagram which shows the sequence of programming pulses required to program the interface 12' so that $P_1$ will be coupled to $I_2$, $P_2$ coupled to $I_3$ and $P_3$ coupled to $I_1$. The duration of each of the pulses is arbitrary and can be made as short as desired, considering of course, the circuit response time. The programming pulses as shown in FIG. 6 can be seen to have two levels, 5 and 10 volts. This two level type pulse is shown in FIG. 6 to emphasize that certain functions must occur before others in order that the circuit operate properly. Specifically, in the course of setting an EEROM associated with one of the P busses, it is essential that the lockout signal (low on LKT) be effective to lockout all unset couplers associated with the same P bus before the enable signal generated by the EEROM being set is effective in setting the next EEROM in line. In most cases there would be enough gate delay in the enable path to avoid such a problem even if the programming pulses did not have two amplitudes, however, if the programming pulses are as shown in FIG. 6, it can be seen that the required sequence of events is assured.

Figure 7:
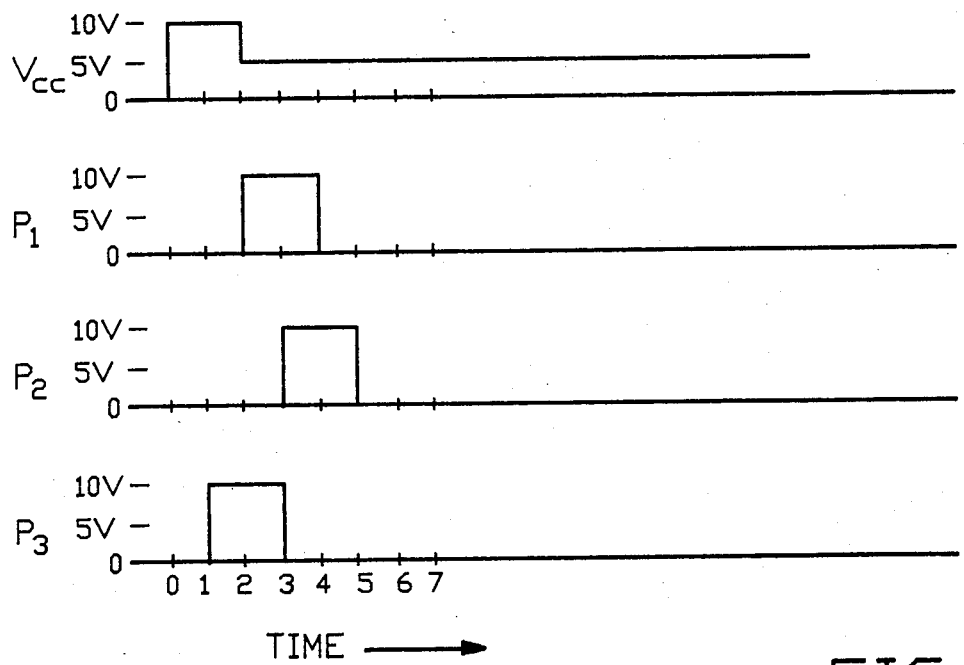
FIG. 7 is a timing diagram similar to that shown in FIG. 6 but using a different form of programming pulse.

Assuming that there is sufficient gate delay to assure proper operation, a pulse sequence with a single voltage level as shown in FIG. 7 could be used to program the interface. Alternatively, programming pulses with relatively long rise times, could be used so that the 5 volt level of the pulse occurs sufficiently before the 10 volt level to assure reliable operation. For purposes of clarity in explanation, the following discussion assumes the form of pulse as shown in FIG. 6.

The first step in programming is to raise VCC from its normal 5 volt level to 10 volts (time 0). This initiates the programming sequence by erasing all previous programming. If one of the EEROMs in any column had been set, a high signal will appear on the DIS line for that column (through diode 23 or 23' of the associated coupler). A 10 volt signal on VCC in conjunction with a signal on the DIS line will turn the associated AND gate 32 on which will in turn apply a signal to the RST terminals of each coupler 14 in the column, erasing the EEROM that had been set (if it was in a coupler 14). If an EEROM in a coupler 13 had been set, it is also erased since the VCC high signal is applied directly to the RST terminals of the couplers 13. Note that since all of the P terminals are at zero volts at this time, AND gates 26' are off, and a signal at the RST terminal of a coupler (13) will turn AND gate 28' on, erasing the EEROM. When all of the set EEROMs are erased by the action of VCC, it can be seen that all of the DIS terminals will be low and inverters 33 will apply a high signal to each LKT terminal of the couplers 13 and 14. A low signal from the EEROMs 22, 22' assures that AND gates 20, 20' and 24, 24' are off and therefore that the ENO outputs are low. Thus, the only couplers which are in condition to have their EEROMs set are couplers 13, all of which are associated with the $I_1$ bus.

The priority sequence which is utilized in programming the presently preferred embodiment of the invention is to first couple $I_1$ to its associated P bus, followed by $I_2$, $I_3$ etc., in order, until all of the I inputs are coupled to the desired P input terminals. The enable interconnections (ENO and ENI) between the couplers assure that this sequence is followed.

At time 1, the voltage on terminal $P_3$ is raised to 5 volts. Since there is a high signal on the LKT terminals of the couplers in column 3 (13-3-1 and 14-3-3) AND gates 26 and 26' are on. AND gate 27 of coupler 14-3-3 is off, however, since there is a low signal on the ENI terminal of the coupler. The RST terminal of coupler 13-3-1 is high since VCC is still at 10 volts. This turns on AND gate 27' setting EEROM 22'. When EEROM 22' of coupler 13-3-1 is set (i.e. puts out a logical "1" signal), AND gate 20' is turned on and also a signal-appears at the coupler DIS terminal. This causes the LKT terminals of all of the couplers in column 3 to go low. A low LKT signal locks out all of the couplers in the column and prevents more than one I bus being coupled to any P terminal.

At time 2, VCC is reduced back to its normal 5 volt level and $P_3$ is raised to 10 volts. This causes a 5 volt signal to be applied to the PHI terminals of the couplers in column 3. Since AND gate 20' is on, AND gate 24' also is turned on and a signal appears at the enable output (ENO) terminal of coupler 13-3-1. This signal is coupled to the enable input (ENI) terminals of the couplers associated with $I_2$, namely 14-1-2 and 14-2-2.

Also at time 2 the voltage on terminal $P_1$ is raised from zero to 5 volts. EEROM 22 of coupler 14-1-2 becomes set since there are then signals on the $P_1$ bus and on terminals ENI and LKT of the coupler. The LKT signal is present because there are no EEROMs in column 1 set. The absence of a set EEROM results in no DIS signal which in turn, because of inverter 33, results in LKT being high. When EEROM 22 of coupler 14-1-2 becomes set, AND gate 20 couples terminal $P_1$ to the $I_2$ bus. A DIS signal also appears on coupler 14-1-2 and LKT goes low on all couplers in column 1 assuring that no more EEROMs in column 1 can be set.

When $P_1$ goes to 10 volts at time 3, AND gate 24 of coupler 14-1-2 goes on, creating a signal at the enable out (ENO) terminal. This signal is coupled to the enable in (ENI) terminals of all of the couplers associated with the next I bus, $I_3$.

At the same time (time 3) $P_2$ is raised to 5 volts and the same sequence of steps as outlined above sets EEROM 22 of coupler 14-2-3. It is not necessary to raise $P_2$ to 10 volts as it was in connection with programming the couplers for $I_1$ and $I_2$. This is because the 10 volt level is used to enable the programming of the following I bus and since $I_3$ is the last I bus in the example described there is no following I bus. For purposes of consistency, however, this pulse is shown having the same form as the others.

Each of the I busses feeds into an AND gate 34. The purpose of the AND gates 34 is to avoid coupling a programming signal (from a P bus) to the system 11' while the programming sequence is under way. This is avoided by interrupting the signal flow along an I bus during the time that programming of that bus is in progress. Specifically, whenever the enable input or output of a Control Signal Coupler is high, the associated NOR gate 35 causes AND gate 34 to decouple the I bus from system 11'.

After the system is programmed as described above any control signal applied to $P_1$ will be coupled through AND gate 20 of Control Signal Coupler 14-1-2 to input $I_2$ of system 11' and similarly $P_2$ will be gated to $I_3$ and $P_3$ to $I_1$. This is illustrated in FIG. 2 which shows the interconnections of the three terminal system described where the dotted lines within interface 12' show the control signal paths as established by programming the interface in accordance with the example explained. The interface can be reprogrammed to provide a different allocation of input terminals as desired by simply repeating the above described steps with such alterations as needed to comply with the programming priority system.

If, for example, it is desired to reprogram the interface so that $P_1$ would couple to $I_1$, $P_2$ to $I_2$, and $P_3$ to $I_3$, the reprogramming would start at time zero by raising VCC to 10 volts as before, but at time 1, instead of initiating a programming pulse on $P_3$, the first programming pulse would be applied to the P bus which is desired to be coupled to $I_1$, namely $P_1$. The next programming pulse would be on $P_2$ since it is intended that $P_2$ be coupled to $I_2$. The last programming pulse would then be applied to $P_3$.

What has been described is a novel programmable interface which allows complete flexibility in coupling control signals to a controlled system. While the invented interface has been described in connection with a specific application of the invention, those skilled in the art will be aware that the invention as described, or with obvious modifications, can be applied in other contexts. It is intended that the invented interface as described, or with such modifications as would occur to those skilled in the art, in connection with all applications be covered within the spirit of the following claims.

I claim:

1. A programmable interface for coupling an electronic system to a source of control signals, said interface comprising:
    input means for connecting to said source of control signals;
    output means for connecting to said electronic system; and
    crossbar switching means for selectively establishing at least one signal path from said input means to said output means when said interface is in a first operating mode, said crossbar switching means including electrically erasable read-only memory means for being set to determine said signal path, said signal path being programmable in a second operating mode of said interface in response to a pulse signal provided through said input means and coupled to said electrically erasable read-only memory means.

2. The interface of claim 1 wherein said input means includes a plurality of input lines and said output means includes a plurality of intersecting output lines, and wherein said crossbar switching means is adapted to provide a plurality of signal paths such that each input line is coupled to no more than one output line, and wherein said pulse signal during said second operating mode incudes a plurality of pulses for sequentially establishing each of said signal paths.

3. The interface of claim 2 further comprising means responsive to an external signal for placing said interface in said second operating mode.

4. The interface of claim 3 further comprising means for decoupling said output lines from said electronic system when said interface is in said second operating mode.

5. An apparatus comprising:
an electronic circuit having a plurality of circuit locations for receiving respective input control signals; and
interface means for coupling said circuit locations to a source of said control signals, said interface means including:
input means for connecting to said source of said input control signals, said input means including a plurality of input lines;
output means for connecting to said plurality of circuit locations, said output means including a plurality of output lines intersecting said input lines; and
crossbar switching means for selectively establishing a plurality of signal paths from said input means to said output means when said interface is in a first operating mode, said crossbar switching means including electrically erasable read-only memory means for being set to determine said signal paths, said signal paths being programmable in a second operating mode of said interface in response to a plurality of pulses applied to said input means which sequentially establish each of said signal paths, said plurality of pulses being coupled to said electrically erasable read-only memory means.

6. The apparatus of claim 5 further comprising power supply means for providing power to said electronic circuit and to said interface means from an external power source, said interface means assuming said second operating mode in response to an external signal on said power supply means.

7. The apparatus of claim 5 further comprising means for decoupling said output lines from said electronic circuit when said interface means is in said second operating mode.

8. An integrated circuit comprising:
an electronic circuit having a plurality of circuit locations for receiving respective input control signals;
a plurality of input pins; and
a plurality of programmable control signal couplers each connected to a respective input pin and a respective circuit location and each including a memory means for determining whether its respective input pin is coupled to its respective circuit location, said control signal couplers operating in a first mode to establish a plurality of signal paths such that each of said input pins is coupled to no more than one of said circuit locations, said control signal couplers operating in a second mode wherein said signal paths are programmable by selectively turning on or off said memory means in response to pulse signals applied to said input pins.

9. The integrated circuit of claim 8 further comprising:
a power supply pin coupled to said electronic circuit for supplying operating voltage to said integrated circuit; and
first logic means coupled to said power supply pin and to said control signal couplers for initiating said second mode in response to a voltage signal on said power supply pin of a predetermined magnitude in excess of said operating voltage.

10. The integrated circuit of claim 9 further comprising:
decouple logic means coupled to said control signal couplers and to said circuit locations for decoupling said control signal couplers from said circuit locations while operating in said second mode.

11. The integrated circuit of claim 8 wherein each of said memory means includes an electrically erasable read-only memory.

* * * * *